United States Patent
Edwards et al.

(10) Patent No.: US 9,484,435 B2
(45) Date of Patent: Nov. 1, 2016

(54) MOS TRANSISTOR WITH VARYING CHANNEL WIDTH

(75) Inventors: Henry Litzmann Edwards, Garland, TX (US); Tathagata Chatterjee, Allen, TX (US); Mohamed Kamel Mahmoud, Wylie, TX (US); Gabriel J. Gomez, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 456 days.

(21) Appl. No.: 11/959,921

(22) Filed: Dec. 19, 2007

(65) Prior Publication Data

US 2009/0159967 A1    Jun. 25, 2009

(51) Int. Cl.
| | | |
|---|---|---|
| H01L 23/58 | (2006.01) | |
| H01L 29/66 | (2006.01) | |
| H01L 21/28 | (2006.01) | |
| H01L 29/10 | (2006.01) | |
| H01L 29/423 | (2006.01) | |
| H01L 29/78 | (2006.01) | |

(52) U.S. Cl.
CPC ... *H01L 29/66659* (2013.01); *H01L 21/28114* (2013.01); *H01L 29/1045* (2013.01); *H01L 29/4238* (2013.01); *H01L 29/6659* (2013.01); *H01L 29/7833* (2013.01)

(58) Field of Classification Search
CPC ............. H01L 29/6659; H01L 21/26586; H01L 29/1083; H01L 29/785
USPC .......... 257/E21.558, 333, 647; 438/147, 163
See application file for complete search history.

(56) References Cited

U.S. PATENT DOCUMENTS

| | | | |
|---|---|---|---|
| 5,006,911 A | 4/1991 | Sivan | |
| 6,093,592 A * | 7/2000 | Nakabayashi et al. | 438/221 |
| 6,362,054 B1 * | 3/2002 | Choi et al. | 438/266 |
| 6,583,469 B1 * | 6/2003 | Fried et al. | 257/329 |
| 6,764,884 B1 * | 7/2004 | Yu et al. | 438/157 |
| 6,905,921 B1 * | 6/2005 | Liu | H01L 21/26513 257/408 |
| 7,011,998 B1 * | 3/2006 | Ju et al. | 438/197 |
| 7,161,199 B2 | 1/2007 | Chen et al. | |
| 7,193,275 B2 * | 3/2007 | Hirotsu | H01L 29/4238 257/366 |
| 7,321,139 B2 | 1/2008 | Chang et al. | |
| 2002/0110974 A1 * | 8/2002 | Forbes | B82Y 10/00 438/217 |
| 2005/0247976 A1 * | 11/2005 | Ting et al. | 257/344 |
| 2007/0018245 A1 * | 1/2007 | Jeng | 257/344 |

(Continued)

OTHER PUBLICATIONS

"Impact of pocket implant on MOSFET mismatch for advanced CMOS technology", K. Rochereau, R. Difrenza, J. McGinley, O. Noblanc, C. Julien, S. Parihar and P. Llinares, Proc. IEEE 2004 int. Conference on Microelectronic Test Structures, vol. 17, Mar. 2004, pp. 123-126.

(Continued)

*Primary Examiner* — David Chen
(74) *Attorney, Agent, or Firm* — Andrew Viger; Frank D. Cimino (57) ABSTRACT

One embodiment of the invention relates to a semiconductor device formed over a semiconductor body. In this device, source and drain regions are formed in the body about lateral edges of a gate electrode and are separated from one another by a gate length. A channel region, which is configured to allow charged carriers to selectively flow between the source and drain regions during operation of the device, has differing widths under the gate electrode. These widths are generally perpendicular to the gate length. Other devices, methods, and systems are also disclosed.

6 Claims, 11 Drawing Sheets

(56) References Cited

U.S. PATENT DOCUMENTS

| | | | |
|---|---|---|---|
| 2007/0063261 A1* | 3/2007 | Chen et al. | 257/316 |
| 2007/0252180 A1* | 11/2007 | Ono | 257/288 |
| 2007/0278613 A1 | 12/2007 | Imade | |
| 2008/0048267 A1 | 2/2008 | Richardson et al. | |
| 2008/0054346 A1* | 3/2008 | Saitoh | H01L 21/845 257/324 |

OTHER PUBLICATIONS

"A Three-Transistor Threshold Voltage Model for Halo Processes," IDM, 2002, pp. 5.2.1-5.2.4 (Rios, et al.).

"Matching Properties of MOS Transistors," IEEE Journal of Solid-State Circuits, vol. 24. No. 5, Oct. 1989, pp. 1433-1440 (Pelgrom, et al.).

* cited by examiner

MOS TRANSISTOR WITH VARYING CHANNEL WIDTH

This application claims priority as a continuation-in-part to U.S. application Ser. No. 11/948,172 filed Nov. 30, 2007, entitled "Matched Analog CMOS Transistors with Extension Wells."

FIELD OF INVENTION

The present invention relates generally to semiconductor devices; and, more particularly, to providing transistors with improved characteristics for matching.

BACKGROUND

Since semiconductor transistors were first implemented, there has been an ongoing effort to reduce the area that individual transistors take up on an integrated circuit (i.e., "shrink" them), thereby allowing more transistors to fit on the integrated circuit. This trend is one factor that helps manufacturers to produce more powerful integrated circuits that have more functionality than previous generations. Indeed, this is one factor that has helped to usher in the communications age as we know it.

In addition to shrinking the area of individual transistors, in many applications designers also go to great lengths to match the characteristics of various transistors on a single integrated circuit. For example, designers often match transistor geometries (i.e., layouts) so that the different transistors experience similar electrical stresses with respect to surrounding devices. Depending on design constraints, designers may want to match the gains ($\Box$), currents delivered ($I_{DS}$), voltage thresholds ($V_T$), or other transistor characteristics of two or more transistors.

Accordingly, there is an ongoing need for integrated circuits that strike a balance between minimal transistor area and precise matching.

SUMMARY

One embodiment of the invention relates to a semiconductor device formed over a semiconductor body. In this device, source and drain regions are formed in the body about lateral edges of a gate electrode and are separated from one another by a gate length. A channel region, which is configured to allow charged carriers to selectively flow between the source and drain regions during operation of the device, has differing widths under the gate electrode. These widths are generally perpendicular to the gate length. Other devices, methods, and systems are also disclosed.

BRIEF DESCRIPTION OF THE DRAWINGS

FIGS. 8-12B are top and cross-sectional views showing various stages of manufacture of a varying channel width transistor, in accordance with an embodiment of the method shown in FIG. 7;

DETAILED DESCRIPTION OF EXAMPLE EMBODIMENTS

Figure 1A:
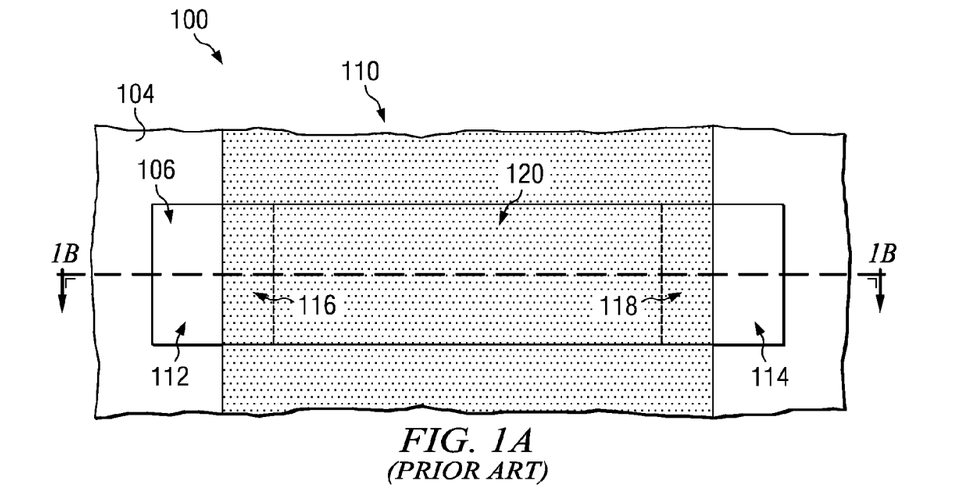
FIGS. 1A-1C (Prior Art) are top and cross-sectional views showing the structure of a conventional transistor.
Figure 1B:
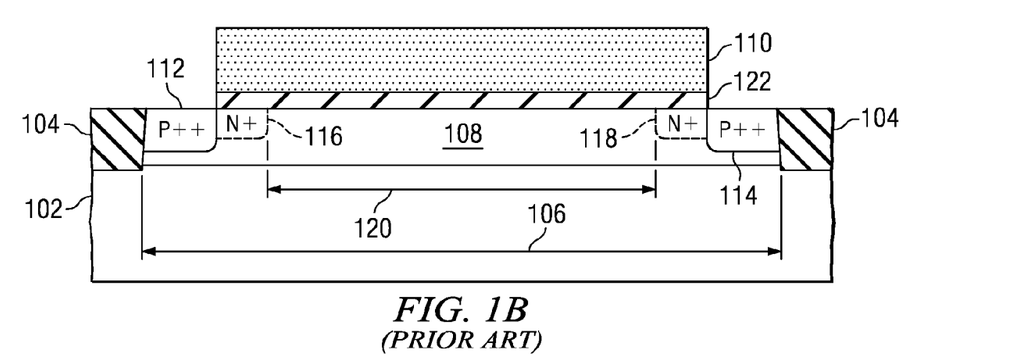
Figure 1C:
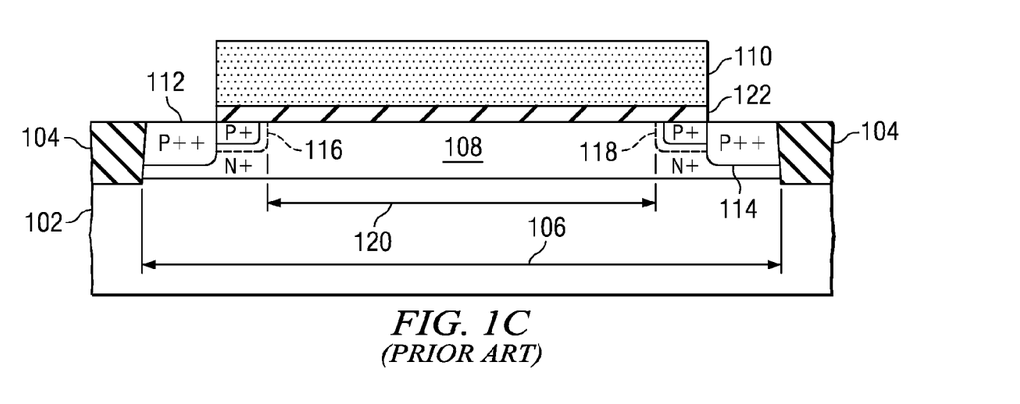

FIGS. 1A-1C show a traditional metal oxide semiconductor field effect transistor (MOSFET) 100 having a patterned gate structure formed over a rectangular active region 106 (sometimes called a moat) defined by isolation regions formed in a semiconductor substrate 102. The isolation regions typically comprise a trench 104, filled with oxide or other dielectric material, that surrounds and defines the rectangular active region 106, isolating the active region 106 from other similar structures formed within the semiconductor body. In the illustrated embodiment, the active region 106 may be implanted to form a lightly doped well 108 of a first conductivity type between isolation regions of trench 104 within the substrate 102 (FIG. 1B).

The gate structure comprises a layer of dielectric material 122 formed over the substrate 102 and a gate electrode 110 formed over the layer of dielectric material 122. The well region 108 is implanted with dopant to form source and drain regions 112, 114 of a second conductivity type laterally disposed adjacent respective sides of the gate electrode 110, with a channel region defined under the gate structure between the source and drain regions 112, 114. Pocket implant regions 116, 118 of the first conductivity type are typically formed underneath and near the lateral edges of the gate electrode 110, and a bulk region 120 of the well region 108 separates the pocket implant regions 116, 118 from one another.

The doping configuration shown in the embodiment illustrated in FIGS. 1A-1C is that of a typical PMOS structure, wherein the source and drain regions 112, 114 are regions of p-type conductivity (highly doped P++ regions), the bulk region 120 is a region of n-type conductivity (lightly doped N− region) and the pocket implant regions 116, 118 are regions of n-type conductivity (highly doped N+ regions). In such a PMOS device configuration, the substrate 102 could be a lightly doped p-type material (P−). As shown in FIG. 1C, the device may also include source and drain extension regions doped with the same type conductivity as the source/drain regions 112, 114, i.e., p-type doping (P+) for the illustrated PMOS configuration.

During operation, current selectively flows between the source and drain regions 112, 114 through the pocket implant regions 116, 118 and the bulk region 120 (i.e., through the channel region), depending on the bias applied to the device (i.e., responsive to an amount of voltage applied to the gate electrode).

As shown in FIGS. 1A-1C, in traditional MOS transistor structures the active region 106 has a generally rectangular configuration with an elongation in the channel length direction (left to right or right to left direction, in the direction of current flow in FIGS. 1A-1C) and a constant width under the gate electrode 110 in the channel width direction (top to bottom or bottom to top direction, perpendicular to current flow in FIG. 1A). The gate electrode 110 extends transversely across the active region 106, over the layer of dielectric material 122. In FIGS. 1A-1C, the gate 110 is shown running perpendicular to the elongation of the active region 106, with lateral sides that are generally parallel to width ends of active region 106, and to corresponding lateral sides of boundaries of source/drain regions 112, 114 and pocket regions 116, 118.

Figure 17:
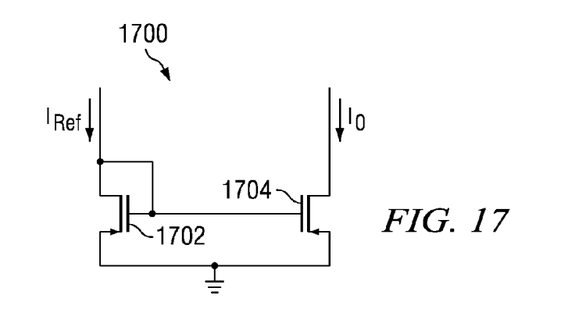
FIG. 17 is a schematic view of a circuit having first and second matched transistors.

FIG. 17 shows an example integrated circuit 1700 that includes first and second matched MOSFET transistors 1702, 1704 which have identical length-to-width ratios. The matched transistors 1702, 1704 are associated with analog circuitry that utilizes a matching characteristic of the first and second matched transistors to facilitate analog functionality. In the illustrated embodiment, the circuitry comprises a current mirror wherein the first and second matched transistors 1702, 1704 provide matched currents $I_{Ref}$, $I_0$ along two legs of the current mirror. Because a common gate voltage is applied to the gate electrodes of the matched transistors 1702, 1704 and a common (albeit changing) drain-source voltage ($V_{DS}$) is also established, the transistors are able to provide matched currents $I_{Ref}$, $I_0$ between their sources and drains ($I_{DS}$). This allows the current mirror to be used to supply current to another block. In other embodiments, matched transistors may be used in amplifiers, or in any of a number of other types of analog circuits.

As the inventors have appreciated, the matching of conventional MOSFET transistors like transistor 100 shown in FIGS. 1A-1C for use in circuits such as current mirror circuit 1700 may be inadequate. Because the concentration of dopant atoms in the pocket implant regions 116, 118 is difficult to precisely control (e.g., due to statistical variations in the small number of atoms that make up the pocket region), the potential barriers associated with the pocket implant regions 116, 118 can vary widely from one transistor to another. This makes it difficult to precisely match one transistor to another, particularly at low overdrive ($V_{GS}$-$V_T$) values used to save headroom in analog circuits.

By analyzing the relative contributions of the bulk region 120 and pocket regions 116, 118 to matching in the device 100, the inventors have appreciated that the majority of the area in the bulk region 120 may be wasted in terms of the ability to match one transistor to another. The inventors have taken advantage of this realization by fashioning devices with I-shaped, T-shaped or other varying width channel regions instead of with rectangular-shaped channel regions having uniform widths. These varying width channel regions may be achieved by shaping isolation regions to form correspondingly shaped active areas or by utilizing doping variations to form correspondingly shaped implanted regions under the gate electrode. Some illustrative devices and methods are given below.

Figure 2A:
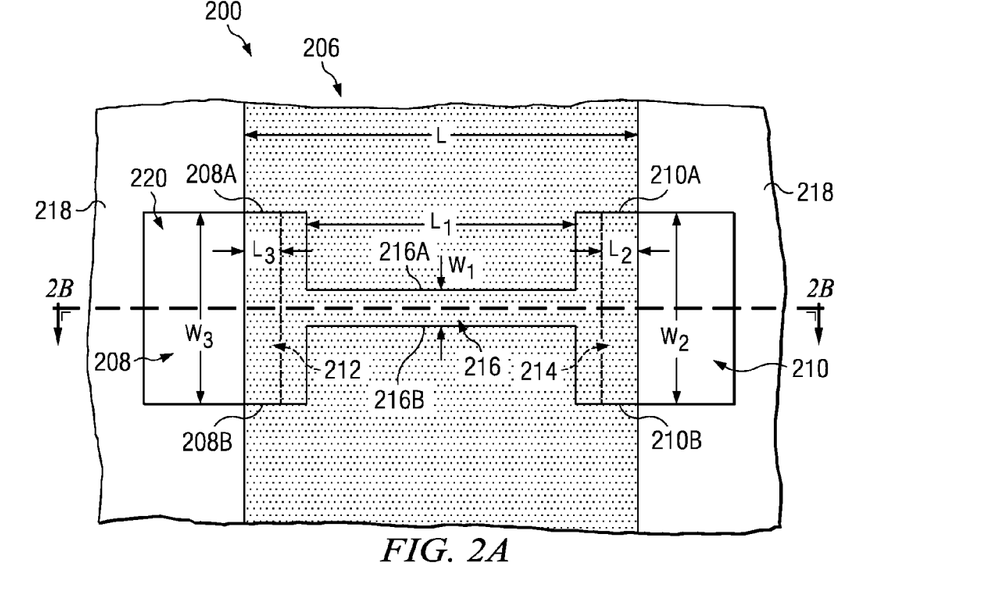
FIGS. 2A-2C are top and cross-sectional views of an example implementation of a transistor with a varying channel width according to the principles of the invention in the form of a transistor having an I-shaped stepped width channel.
Figure 2B:
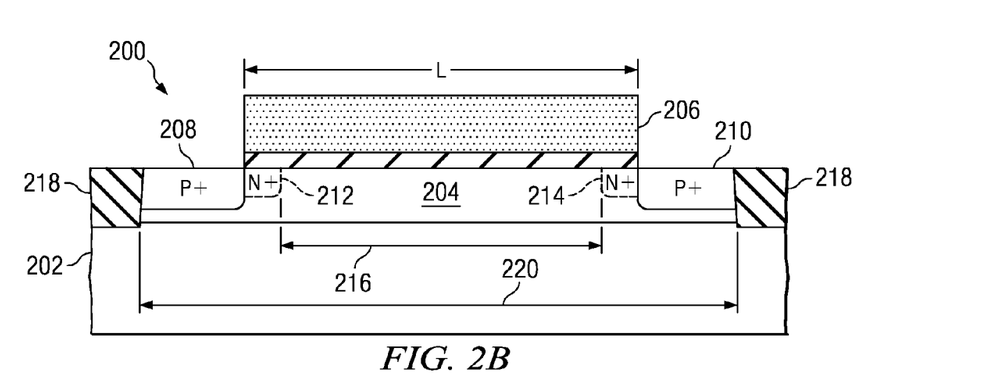
Figure 2C:
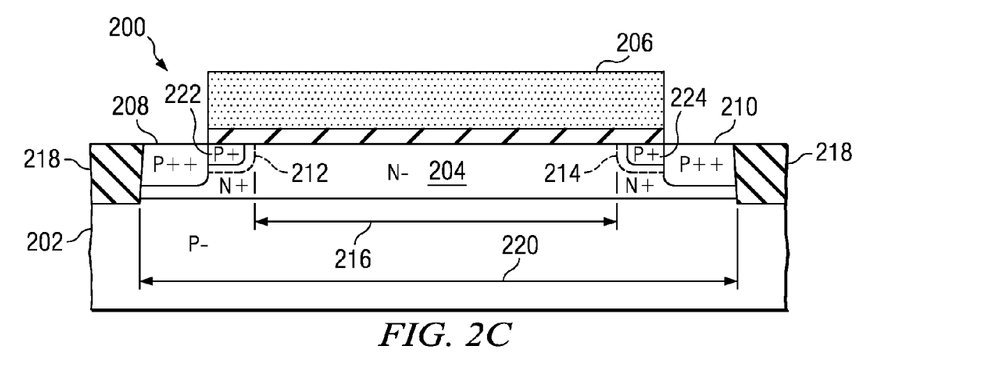

FIGS. 2A-2C show a transistor 200 formed within a shallow trench isolation structure that defines a stepped varying width active region that facilitates the formation of an I-shaped channel region. Like transistor 100, transistor 200 is formed on a semiconductor substrate 202 in which a lightly doped well 204 is formed. Transistor 200 includes a gate electrode 206 with gate length L formed over a layer of dielectric material and extending transversely over the I-shaped active region. An I-shaped channel region is defined between source and drain regions 208, 210 that are formed in the active region by implanting dopant adjacent respective lateral sides of the gate electrode. Pocket implant regions 212, 214, which are separated from one another by a bulk region 216, are formed by implanting dopant under the gate electrode 206 at the lateral side edges of the gate electrode 206. In some embodiments, the gate structure may also include spacers or other known conventional features not shown in FIGS. 2A-2C.

The transistor 200 is formed within an isolation trench 218 that defines an I-shaped isolated active region 220 in the semiconductor substrate 202. This channel region defined between the source and drain regions 208, 210 in the isolated active region 220 includes the I-shaped bulk region 216 and the pocket implant regions 212, 214, with different widths associated therewith. As can be seen in FIG. 2A, the part of the channel region constituted by the I-shaped bulk region 216 has a stepped width variation characterized by three widths $w_1$, $w_2$, $w_3$ under the gate electrode 206. In the illustrated embodiment, width $w_1$ is the width between opposing sidewalls 216A, 216B in a central portion, $w_2$ is the width between opposing sidewalls 210A, 210B in a right end portion, and $w_3$ is the width between opposing sidewalls 208A, 208B in a left end portion. All of these sidewalls are adjacent to and defined by the isolation trench 218.

The pocket implant regions 212, 214 may not coincide exactly with the relatively wide right and left end regions of the I-shaped bulk region 216. Rather, the relatively wide right and left end regions of the bulk region 216 will typically extend further under the gate electrode 206 than the pocket implants 212, 214, in order to avoid current crowding.

In various embodiments where the device 200 is used in an analog manner, the width $w_1$ of the central portion may typically be less than the gate length L. For example, width $w_1$ could be less than the gate length L by a factor of approximately 1 to approximately 50. For the embodiment illustrated in FIGS. 2A-2C, the drain and source regions 208, 210 extend respectively from locations adjacent the opposite ends of the gate electrode 206 to sidewalls at the ends of the I-shaped active region 220, adjacent to and defined by inner boundaries of the isolation trench 218 (right and left regions of 218 shown in FIGS. 2B and 2C), and have the same widths $w_2$ and $w_3$, respectively, as the corresponding neighboring right and left end portions of the bulk region part of the channel region. In the illustrated I-shaped channel configuration 200, the second and third widths $w_2$, $w_3$ are approximately equal to one another and are greater than the first width $w_1$. However, in other embodiments (e.g., in a T-shaped channel configuration discussed below), these widths $w_2$, $w_3$ may differ from one another.

In one embodiment, these widths $w_1$, $w_2$, $w_3$, can be tailored such that two matched transistors in separate isolation structures are optimally matched to one another, while also only taking up minimal area on the integrated circuit. In effect, the described configuration allows a designer to "shrink" a rectangular-shaped channel device without sacrificing quality of matching.

For example, in one embodiment, a designer may want the matching precision of a rectangular-shaped MOSFET channel having a length of 20 um and a width of 2 um, but cannot tolerate the large area (i.e., at least 20 um*2 um=40 um$^2$) required for such a device. Thus, the designer could use an I-shaped MOSFET channel wherein the pocket regions have lengths $L_2$=$L_3$=(about 0.5 um) and widths $w_2$=$w_3$=(about 2 um). The designer could use a bulk region with a total length $(L-L_2-L_3)$=(about 2 um) and a width $w_1$=(about 0.5 um). Thus, the I-shaped channel device with similar matching characteristics would have an active area of about (2×(2 um×0.5 um)+(0.2 um*2 um)=2.4 um$^2$), in other words consuming a rectangular area of (0.5 um+2 um+0.5 um)*2 um=6 um$^2$. Thus, the I-shaped channel device results in a significant reduction in area in comparison to a rectangular-shaped channel device. Of course, these values are only illustrative and it will be appreciated that the lengths and widths of transistors in accordance with the invention could vary widely from those set forth here.

As shown in FIG. 2C, in various embodiments the transistor 200 may also include extension regions 222, 224 adjacently underlying lateral edges of the gate electrode 206 and adjacent to the source and drain regions 208, 210, respectively. These extension regions 222, 224 typically have the same conductivity type as the source and drain 208, 210, albeit at slightly lower concentrations. Thus, in the illustrated PMOS transistor example, the source and drain regions 208, 210 are highly doped p-type conductivity (P++), while the source/drain extension regions 222, 224 are a lower concentration doped p-type conductivity (P+).

Figure 3:
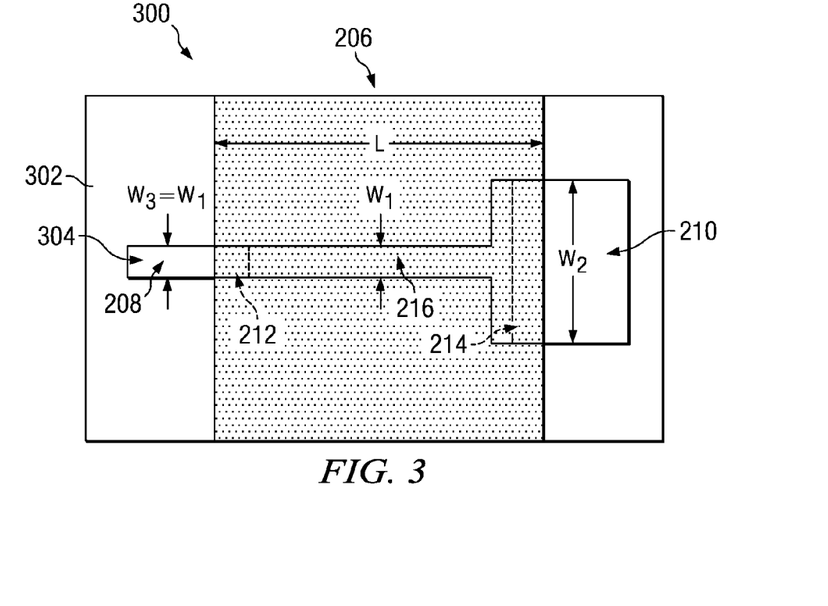
FIG. 3 is a top view of an example transistor with a varying channel width having a T-shaped stepped width channel.

FIG. 3 illustrates another transistor 300 formed within a shallow trench isolation structure 302 that defines a T-shaped isolated active region 304. As shown, in this embodiment, the T-shaped isolated active region 304 may include a corresponding T-shaped channel region constituted by a T-shaped bulk region 216 extending under the gate electrode 206 with first and second different widths $w_1$, $w_2$ between source and drain regions 208, 210, wherein $w_2$ is greater than $w_1$. The drain region 210 may be formed with the same width $w_2$ as pocket region 214 formed at the wider right end portion of the T-shaped bulk region 216, while the source region 208 may be formed with the same width $w_3$=$w_1$ as pocket region 212 formed at the narrower left end portion of the T-shaped bulk region 216. Notably, in some embodiments, this transistor 300 may still have substantially the same matching ability as transistor 200, but consumes less area on the die.

Figure 4:
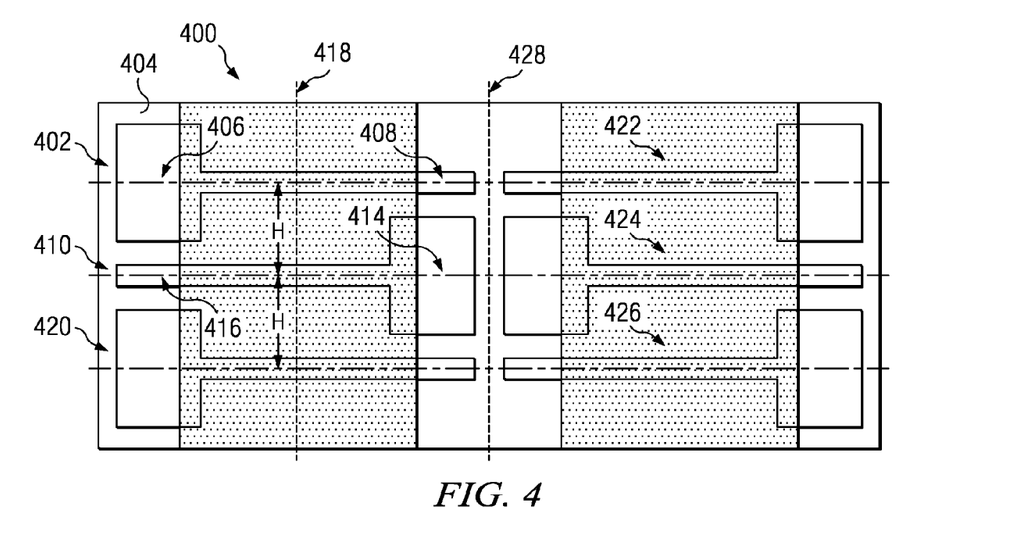
FIG. 4 is a top view of an example array of transistors having T-shaped stepped width channels as in FIG. 3.

T-shaped channel transistors like transistor 300 may be advantageous in that they can be tiled together in an interdigitated way as shown by the example transistor array configuration 400 illustrated in FIG. 4. By interdigitating the T-shaped transistors in this configuration 400, a denser layout may be achieved, potentially providing greater functionality for the overall integrated circuit. The illustrated configuration 400 has a first transistor 402 formed within a T-shaped active area of an isolation structure 404 with a wide drain region 406 and a narrow source region 408. A second transistor 410 is formed such that it also has a wide drain region 414 and narrow source region 416. However, the second transistor 410 is translated vertically by a distance H, relative to the first transistor 402. The second transistor 410 is also rotated 180 degrees about a central axis 418 relative to the first transistor 402. Additional transistors (e.g., transistors 420, 422, 424, 426) are also positioned relative to other transistors in this manner. As shown, adjacent columns of transistors may be rotated 180 degrees about another vertical axis 428 relative to one another.

Figure 5A:
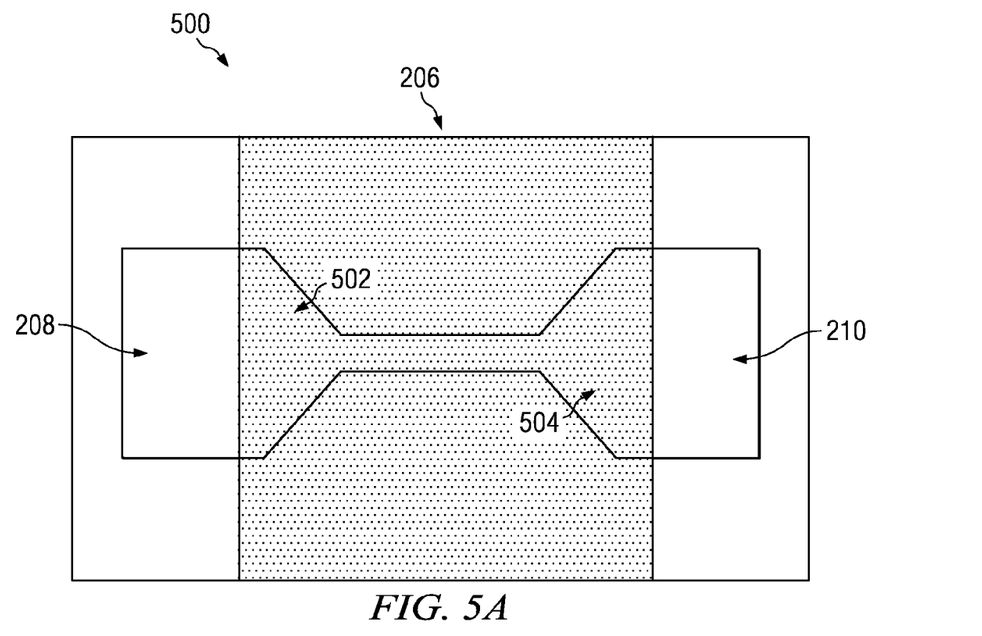
FIGS. 5A and 5B are top views of example transistors with varying channel widths having tapered portions with widths that vary continuously in a linear way.
Figure 5B:
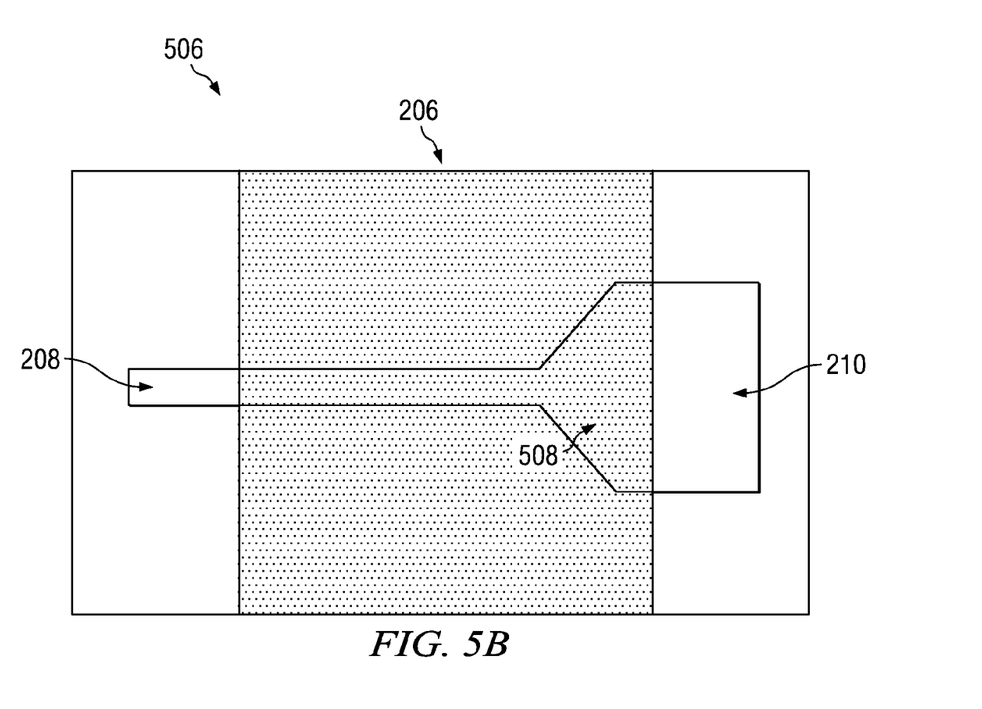
Figure 6A:
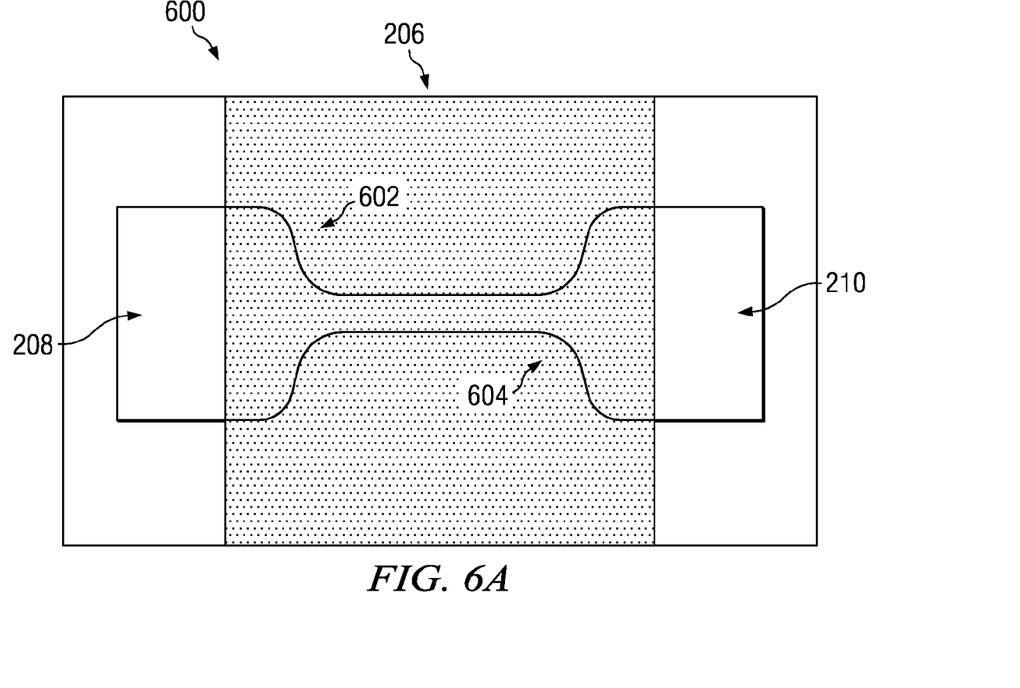
FIGS. 6A and 6B are top views of example transistors with varying channel widths having tapered portions with widths that vary continuously in a nonlinear way.
Figure 6B:
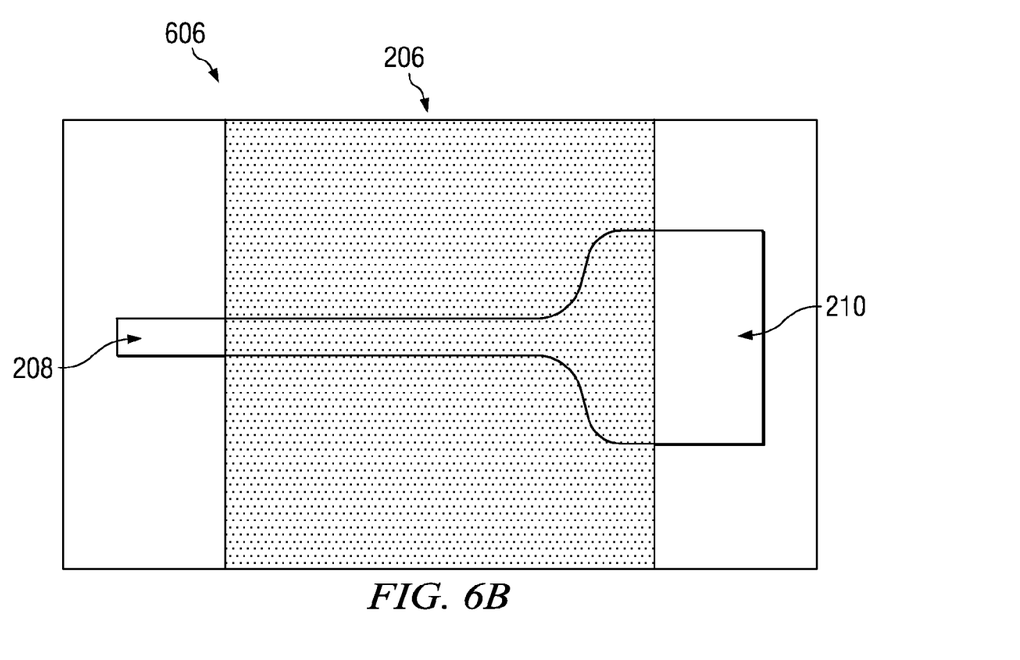

FIGS. 5A, 5B, 6A and 6B show modifications of the devices discussed above, including channel portions having continuously variable channel width. The channel portions have generally I-shaped and T-shaped configurations as discussed above; however, transitions from narrow to wide width portions are tapered rather than stepped. FIGS. 5A and 5B show the width variation using tapering done in a linear continuously varying way relative to channel length, and FIGS. 6A and 6B show similar tapered width variation done in a non-linear continuously varying way.

Generally speaking, in these embodiments, the formation of sharp corners in the I-shaped or T-shaped layouts is avoided in order to minimize process-related mechanical stresses or lithography sensitivity. For example, tapered or rounded corners could minimize current crowding.

As shown in FIG. 5A, an I-shaped layout 500 may have tapered regions 502, 504 under the gate electrode 206. As shown, in FIG. 5B, a T-shaped layout 506 may also have a tapered region 508 under the gate electrode 206. As shown in FIG. 6A, an I-shaped layout 600 could also include rounded corners 602, 604 under the gate electrode 206. As shown in FIG. 6B, a T-shaped layout 606 could similarly use rounded corners under the gate electrode 206. In various embodiments, these rounded corners 602, 604 could follow a Fermi function shape.

Figure 7:
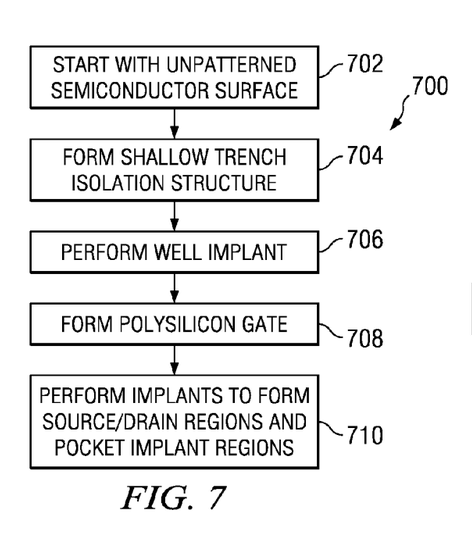
FIG. 7 is a flowchart of a example method for manufacturing a varying channel width transistor in accordance with aspects of the invention.

FIG. 7 is a flowchart illustrating an example general method for making structures as described above. FIGS. 8-12B show steps that could correspond to blocks shown in the flowchart for manufacturing examples of various structures. Although this method is illustrated and described below as a series of acts or events, it will be appreciated that the invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the invention. Furthermore, the methods according to the invention may be implemented in association with the devices and systems illustrated and described herein, as well as in association with other structures.

As shown in FIG. 7, method 700 starts at block 702 with providing a semiconductor body with an unpatterned semiconductor surface. In block 704, a shallow trench isolation structure is formed in the semiconductor body to define isolated active regions or moats to isolate individual devices or groups of devices. In block 706, a well implant is performed in an active region. In block 708, a polysilicon gate is formed over the active region. In block 710, implants are performed to form the source/drain regions adjacent the gate lateral sides and to form the pocket implant regions adjacent the gate edges and extending under the gate.

Figure 8:
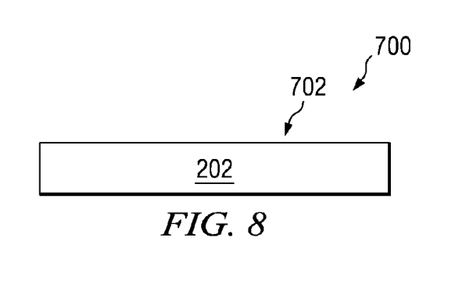

FIG. 8 illustrates providing a semiconductor body in the form of a semiconductor substrate 202, which may comprise a silicon (Si), gallium arsenide (GaAs), silicon germanium (SiGe), silicon-on-insulator (SOI), or any other semiconductor substrate.

Figure 9A:
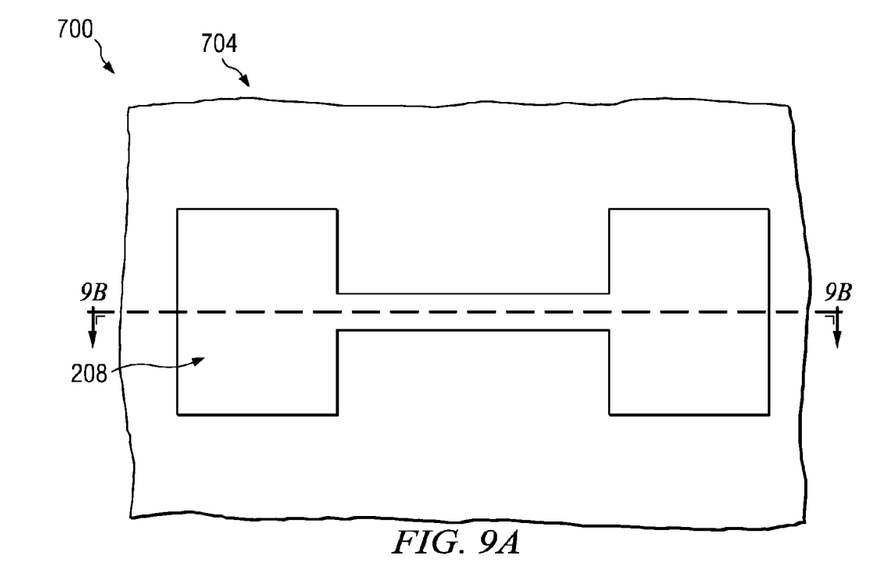
Figure 9B:
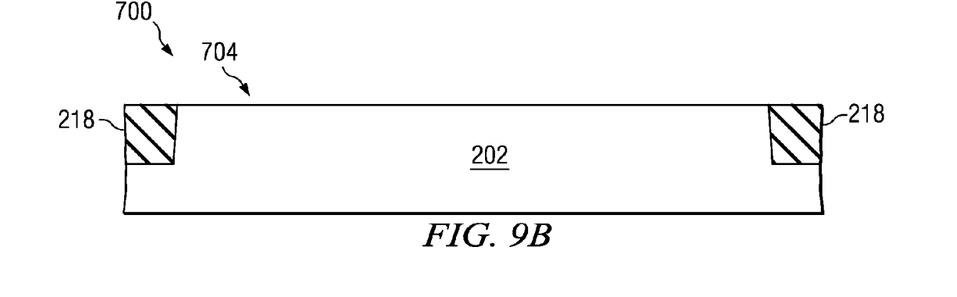

FIGS. 9A and 9B show the formation of an isolation structure 218 within the semiconductor body. FIG. 9A shows an I-shape of an isolated active region 208 defined in the semiconductor substrate 202 by the filled trench of the isolation structure 218. FIG. 9B shows a cross section taken along the section line 9B-9B in FIG. 9A.

Figure 10A:
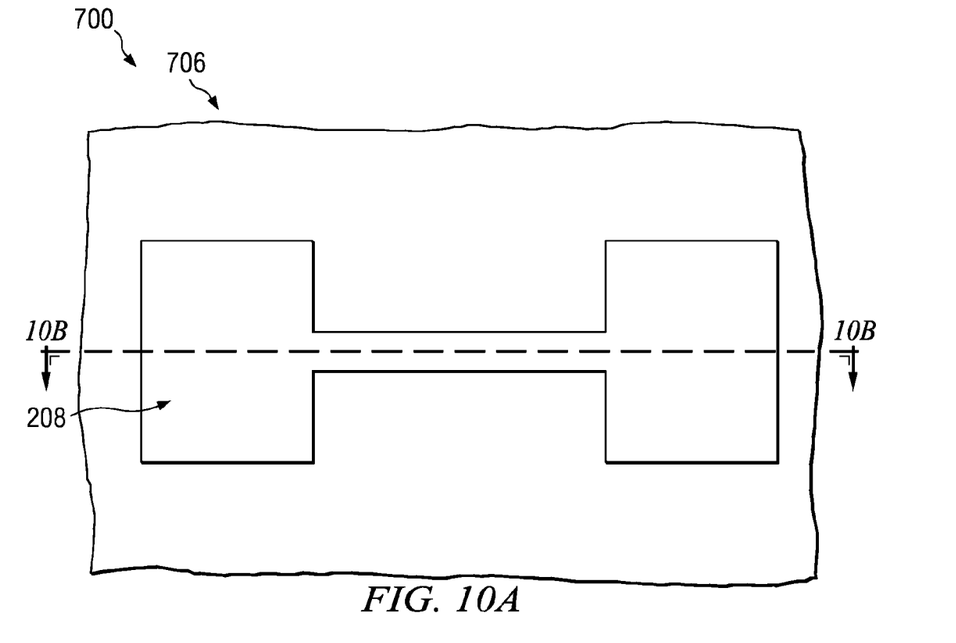
Figure 10B:
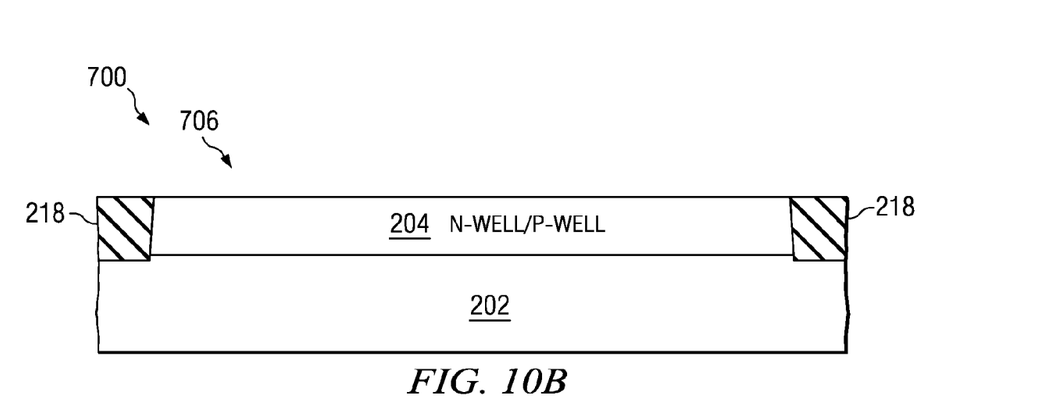

In FIGS. 10A and 10B, an ion implant is performed to form a doped well 204 within the I-shaped isolated active region 208 defined in the semiconductor substrate 202. In an embodiment having a substrate of p-type conductivity, the well could be implanted with n-type conductivity for a PMOS transistor and with p-type conductivity for an NMOS transistor.

Figure 11A:
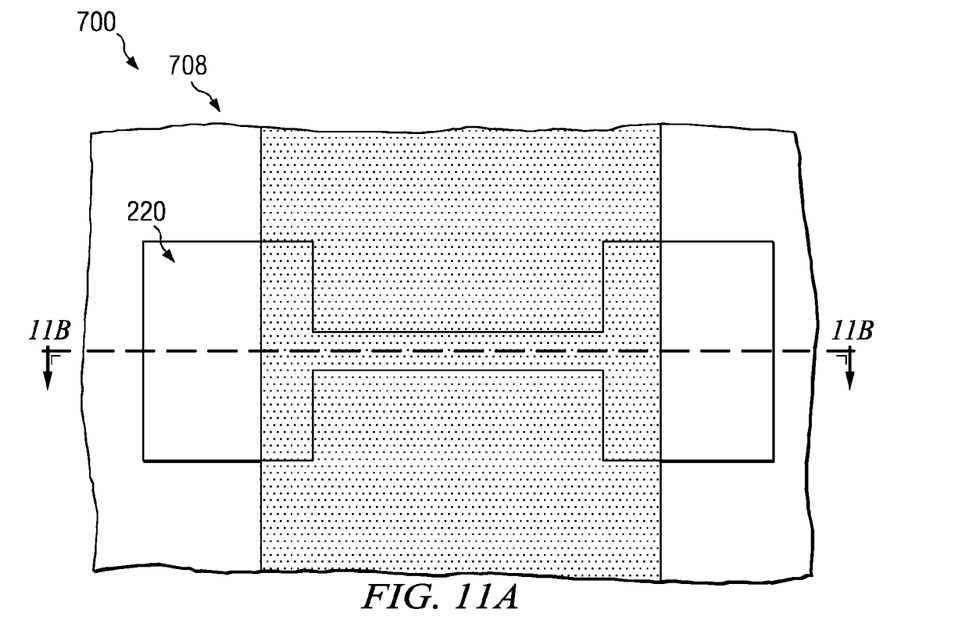
Figure 11B:
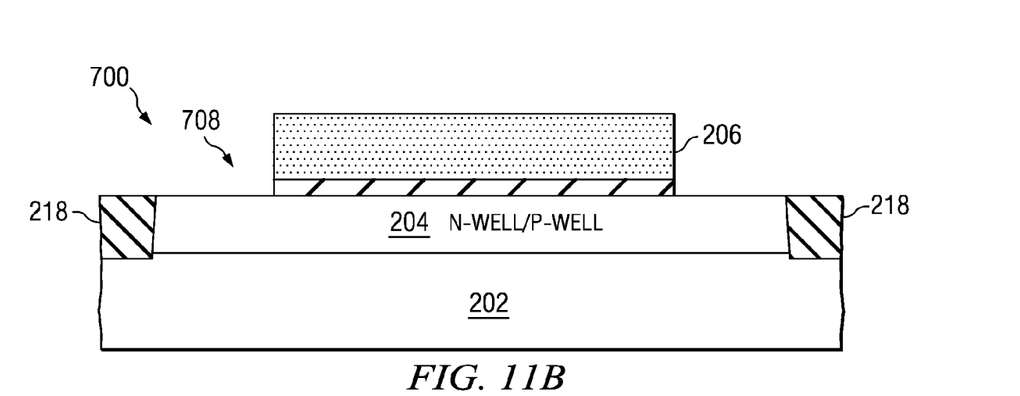

FIGS. 11A and 11B show a gate structure including a gate electrode 206 formed over a layer of gate dielectric material formed over the semiconductor body. In various embodiments, this gate electrode structure could comprise polysilicon or metal.

Figure 12A:
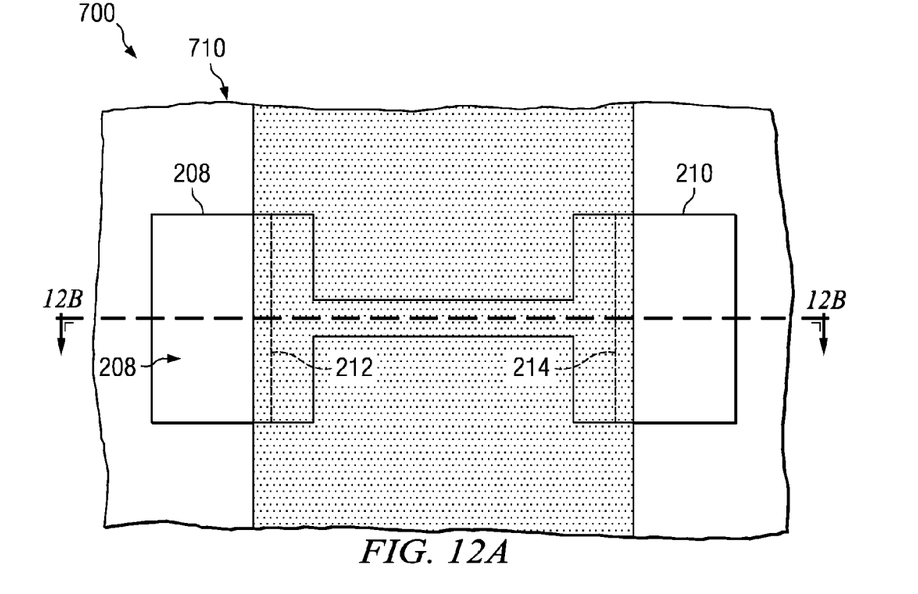
Figure 12B:
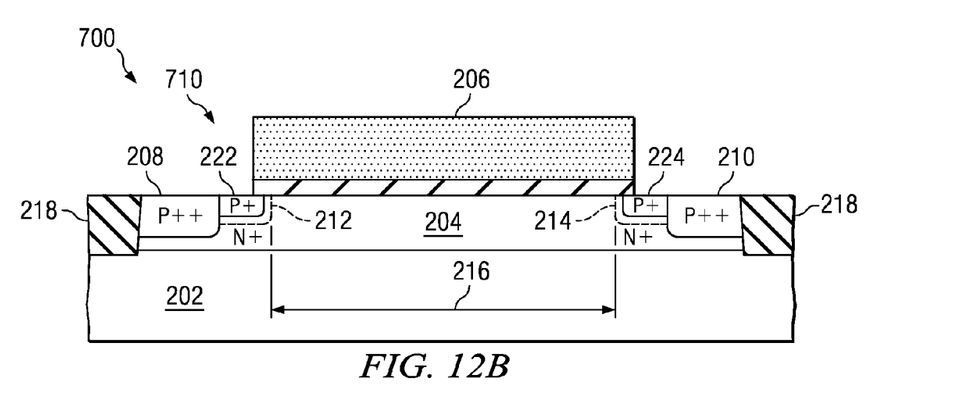

FIGS. 12A and 12B show the device after a source/drain implant has been used to form source and drain regions 208, 210. An angled pocket implant has also been used to form pocket implant regions 212, 214 that extend under the gate electrode 206. In addition, another implant has been used to form source-drain extension regions 222, 224, which could use the same mask as the pocket implant.

FIGS. 13-16 show graphs of performance characteristics of one embodiment of an I-shaped channel device compared to that of a rectangular-shaped channel device. The graphs are in a standard format for matching studies and were obtained using a thin gate oxide NMOS transistor device fabricated in a 65 nm technology. In these graphs, the horizontal axis is $(1/\sqrt{\text{TransistorActiveArea}})$ and the vertical axis is the standard deviation of the mismatch parameter of interest. Generally speaking, the "best" place to be on each graph is at the lower right-hand corner, where the area is small (compact layout) and the matching is tight (low sigma mismatch distribution).

The layout dimensions of studied devices represented in FIGS. 13-16 were as follows: The rectangular devices had gate width-to-gate length (W/L) values of (2/20), (1/10), (0.5, 5), and (0.2/2). By virtue of its large active area, the (W/L)=(2/20) rectangular-shaped channel device corresponds to the data point at the lower left-hand corner of each graph. The I-shaped channel devices were laid out with $W_2=W_3=2$ um, with varying $(W_1/L_1)$ values of (1/10), (0.5/5), and (0.2/2). The $(W_1/L_1)=(1/10)$ corresponds to the left-most data point in the graphs since it has the largest active area of any of the I-shaped channel devices. Since all of the I-shaped channel devices had pocket regions with a width of 2 um, the expectation is that the I-shaped channel devices should show matching similar to that of the rectangular (2/20) device, if the width of the pocket region dominates transistor matching.

Figure 13:
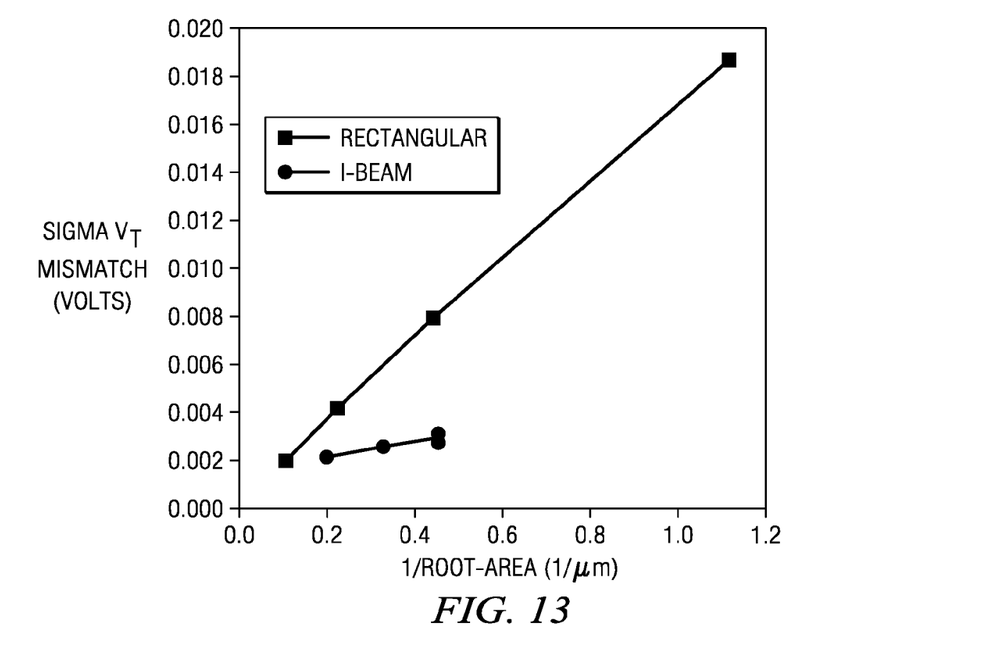
FIGS. 13-16 show graphical plots helpful in understanding aspects of the invention.
Figure 14:
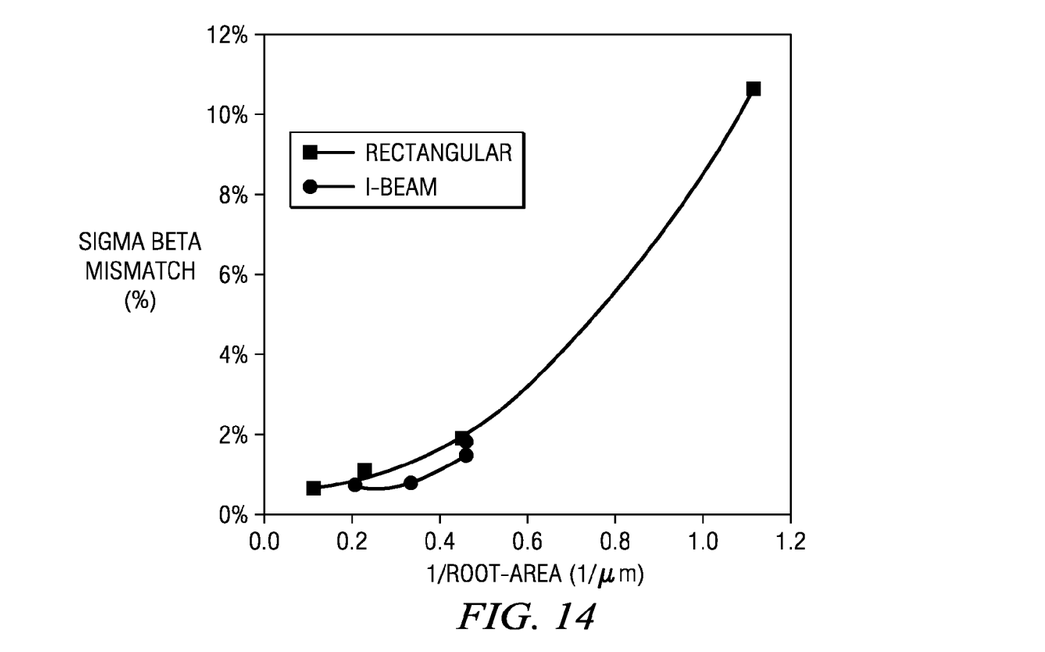
Figure 15:
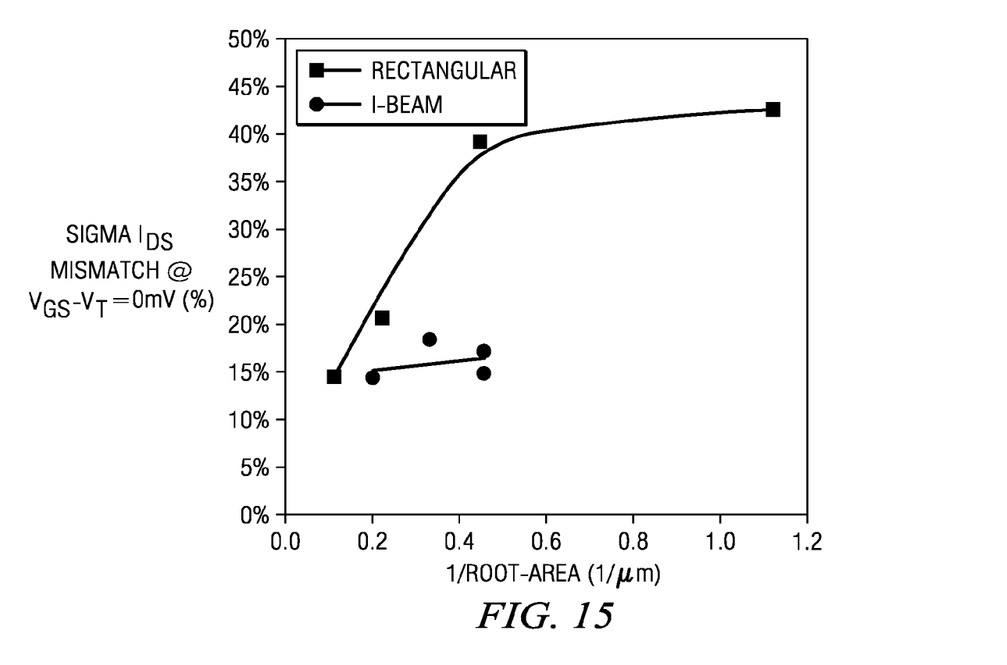
Figure 16:
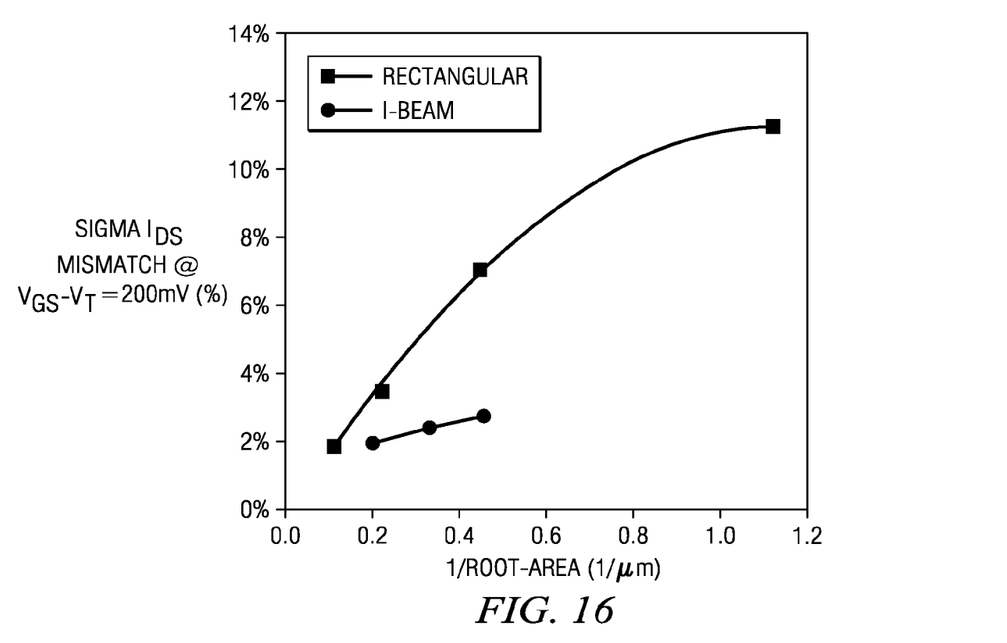

Four mismatch parameters were analyzed for each device style: FIG. 13 shows the voltage threshold ($V_T$) mismatch; FIG. 14 shows the beta mismatch; FIG. 15 shows the current mismatch for sub-threshold inversion (where $V_{GS}-V_T$ is approximately equal to 0 mV); and FIG. 16 shows the current mismatch for strong inversion (where $V_{GS}-V_T$ is approximately equal to 200 mV). For all cases $V_{DS}=V_{DD}$, so the measurements were in the saturation regime. As shown in FIGS. 13-16, the I-shaped channel structures have more compact layout than the (W/L)=(2/20) rectangular device, but they produce similar values of matching, thus showing that the matching of these long-channel devices is largely dominated by the width of the pocket implant regions rather than the area of the bulk region.

It will be appreciated that the described doping schemes can be modified to provide different conductivity type devices than those described. For example, although transistor 200 has been shown as having an n-type conductivity bulk region, and p-type conductivity source and drain regions for the formation of a PMOS transistor device, in other embodiments the doping conventions could be reversed. For example, the bulk region could be made p-type conductivity, and the source and drain regions could be made n-type conductivity for the formation of an NMOS device. Alternatively, the invention could be used with an NMOS transistor device that is placed within a p-type conductivity well or a shallow p-type conductivity well as the body, such that the body is contained within a deep n-type conductivity well, isolating the body from a p-type conductivity substrate.

Although details of the invention have been illustrated and described with respect to one or more example implementations, those skilled in the art to which the invention relates will appreciate that other alterations and/or modifications may be made to the illustrated examples without departing from the spirit and scope of the invention as claimed.

What is claimed is:

1. A semiconductor device, comprising:
an isolation trench formed within a semiconductor substrate and filled with an insulating material, the isolation trench having inner boundaries defining an active region of the semiconductor substrate;
a gate structure formed over the active region; the gate structure comprising a gate electrode formed over a gate dielectric material and extending over the active region in a gate width direction between opposite ends of a channel region of the active region;
source and drain regions formed within the active region, between adjacent respective lateral edges of the gate electrode and the isolation trench, the source and drain regions of a first conductivity type;
the channel region defined under the gate electrode between the source and drain regions within the active region, the channel region of a second conductivity type, the channel region including
a bulk region of the second conductivity type with a bulk-narrow-portion with a relatively narrow width W1, and a length of L1, and at least one bulk-wide-portion with a relatively wide width W2, where the at least one bulk-wide-portion corresponds to a respective end-portion of the channel region that is adjacent either the source or drain region, and
at least one pocket implant region of the second conductivity type implanted within the at least one bulk-wide-portion of the bulk region with a width W2 corresponding to the width of the at least one bulk-wide-portion, under a lateral edge of the gate electrode adjacent either the source or drain region, such that the channel region with length L includes the bulk region, including the at least one bulk-wide-portion with implanted pocket implant region, and the bulk-narrow-portion, and
wherein the at least one pocket implant region has a doping concentration relatively higher than a doping concentration of the bulk region;
the channel region being configured to allow charged carriers to selectively flow between the source and drain regions in a gate length direction through the bulk region, including the at least one pocket implant region implanted within the at least one bulk-wide-portion of the bulk region; and
wherein the semiconductor device is characterized by at least a voltage threshold (VT) mismatch parameter, and the bulk region of the channel region is configured with a W1/L1 ratio of 1/10, such that the at least one pocket implant region, with the relatively wide width W2, dominates matching performance based on the VT mismatch parameter.

2. The device of claim 1, wherein the at least one bulk-wide-portion has a width that is tapered along at least a portion of its length toward the bulk-narrow-portion.

3. The device of claim 1, wherein the at least one bulk-wide-portion has a width including a curved portion that follows a Fermi function.

4. The device of claim 1, wherein the at least one bulk-wide-portion is a first bulk-wide-portion, and the at least one pocket implant region is a first pocket implant region with length L2, and the bulk region further includes a second bulk-wide-portion with a relatively wide width W3 at an end of the bulk-narrow-portion opposite the first bulk-wide-portion; and the channel region further includes a second pocket implant region of the second conductivity type with length L3 implanted within the second bulk-wide-portion of the bulk region, under another lateral edge of the gate electrode adjacent either the source or drain region, wherein the second pocket implant region has a doping concentration relatively higher than the doping concentration of the bulk region;

such that the channel region with length L includes the bulk region, including the first and second bulk-wide-portions with respective implanted first and second pocket implant regions, and the bulk-narrow-portion, such that the channel region, including the bulk region, is generally I-shaped.

5. The device of claim 1, wherein the at least one bulk-wide-portion with the relatively wide width W2 extends in length beyond the at least one pocket implant region with length L2, forming a bulk-extension-portion of the at least one bulk-wide-portion, such that the channel region with length L includes the bulk region with the at least one bulk-wide-portion, including the bulk-extension-portion, and the bulk-narrow-portion.

6. The device of claim 4, wherein the first bulk-wide-portion with the relatively wide width W2 extends in length beyond the first pocket implant region with length L2, forming a first bulk-extension-portion of the first bulk-wide-portion; and the second bulk-wide-portion with the relatively wide width W3 extends in length beyond the second pocket implant region with length L3, forming a second bulk-extension-portion of the second bulk-wide-portion;

such that the channel region with length L includes the bulk region with the first and second bulk-wide-portions, including respective first and second bulk-extension-portions, and the bulk-narrow-portion.

* * * * *